(12) United States Patent
Liu et al.

(10) Patent No.: US 6,191,020 B1
(45) Date of Patent: Feb. 20, 2001

(54) CONDUCTIVE INTERCONNECTION FOR SEMICONDUCTOR INTEGRATED CIRCUIT AND METHOD OF FORMING THE SAME

(75) Inventors: Jing-Meng Liu; Shao-Yu Wang, both of Hsinchu (TW)

(73) Assignee: Taiwan Semiconductor Manufacturing Company, Ltd. (TW)

( * ) Notice: Under 35 U.S.C. 154(b), the term of this patent shall be extended for 0 days.

(21) Appl. No.: 09/081,937

(22) Filed: May 21, 1998

(51) Int. Cl.$^7$ ..................................................... H01L 21/44
(52) U.S. Cl. .................. 438/597; 438/128; 438/129; 438/622; 438/586
(58) Field of Search ........................ 438/597, 598, 438/599, 618, 622, 129, 638, 128, 637, 601, 592, 586, 467, 720

(56) References Cited

U.S. PATENT DOCUMENTS 5,650,651 * 7/1997 Bui ........................................ 257/355
5,903,031 * 5/1999 Yamada et al. ....................... 257/356

* cited by examiner

*Primary Examiner*—Caridad Everhart
(74) *Attorney, Agent, or Firm*—Pillsbury Madison & Sutro, LLP Intellectual Property Group

(57) ABSTRACT

A conductive interconnection for an integrate circuit between a protected node and a protecting node and its method are disclosed. The conductive interconnection comprises a stacking connector, a routing connector and a top conductive line. The stacking connector is formed to connect the protected node, which is constructed by at least one inner conductive line and at least one conductive plug, alternately. The inner conductive line has a length lower than a threshold value constrained by antenna effect. Moreover, the routing connector, extending toward the stacking connector, is formed to connect the protecting node. The top conductive line is used to connect the stacking connector and the routing connector. Accordingly, the protected node is disconnected from the protecting node prior to the formation of the top conductive line.

15 Claims, 4 Drawing Sheets

CONDUCTIVE INTERCONNECTION FOR SEMICONDUCTOR INTEGRATED CIRCUIT AND METHOD OF FORMING THE SAME

BACKGROUND OF THE INVENTION

1. Field of the Invention

The present invention generally relates to semiconductor device fabrication. More particularly, the present invention relates to a conductive interconnection for semiconductor integrated circuit to eliminate the antenna effect while conductive layers are patterned by means of plasma etching processes, and its method of forming the same.

2. Description of the Prior Art

Referring to FIG. 1A, a perspective view of conductive interconnections for an integrated circuit is schematically depicted to explain the antenna effect when a metal layer is patterned by means of plasma etching processes. In the drawing, reference numeral 10 denotes a semiconductor substrate. Field oxides 12 are thermally grown on the substrate 10 and used to define an active region therebetween. A gate oxide layer 14 is formed to overlie the surface of the substrate 10 within the range of the active region. A polysilicon line 16, doped with impurities to increase the conductivity thereof, is formed on the gate oxide layer 14 and extended onto the field oxide 12 for interconnection. The portion of the polysilicon layer 16 formed on the gate oxide layer 14 acts as the gate of a transistor. Reference numeral 18 designates metal lines, one of which is exemplified in FIG. 1A.

In the drawing, the metal line 18 is connected to the polysilicon layer 16 through a contact window. As to the connection of two metal lines, a metal via is utilized instead of the contact window. Nevertheless, both of the contact window and the metal via are openings formed in insulating layers (not shown in the drawing), respectively. Consequently, the overlying layer is deposited on and fills in the associated opening to connect the underlying layer. The portion of the overlying layer filling in the associated opening is called a conductive plug because of its shape. For example, as shown in FIG. 1A, a conductive plug 20 is provided to electrically connect the metal line 18 to the polysilicon layer 16.

In the manufacture of the high-density integrated circuits using multiple metal layer technology, electrical charges may build up at the device gate oxide during plasma etching processing. Plasma is a collection of charged particles, including electrons and positive or negative ions. Therefore, a plasma current density $J_{PLASMA}$ might be either positive or negative according to the polarity of the charged particles. Because there is a direct connection path between the metal line 18 and polysilicon line 16, the charged particles accumulate on the metal line 18 during plasma etch processing flowing towards the gate oxide 14. Therefore, the metal line 18 serves as a current receiver, which will amplify the charging effect. If the exposed area of the metal line 18 during plasma etch processing is large enough to trap the charged particles into the gate oxide and deteriorate the oxide quality; this phenomenon is called "antenna effect."

In general, the larger the exposed metal area during plasma etching processing, the more charged particles will accumulate. The ratio of the exposed metal area to the gate oxide area is defined as an antenna ratio. When the antenna ratio exceeds a threshold value of, for example, about 200, an antenna current, designated as a current density $J_{F-N}$ in FIG. 1A, will be induced to flow through the gate oxide 14 due to Fowler-Nordheim tunneling and cause damage to the gate oxide 14. Accordingly, this antenna effect can cause yield loss and reliability failures.

Referring to FIG. 1B, a diagram for expounding the antenna effect is schematically illustrated. In FIG. 1B, one device U9 has an input terminal 22a standing for a node to be protected, hereinafter referred to as a protected node. As to semiconductor integrated circuit technology, the gate oxide is the most vulnerable to antenna damage, and the protected node 22a stands for the gate of a MOSFET (metal-oxide-semiconductor field-effect transistor) device under the circumstances. Another device U10 has an output terminal 22b, which designates a node that does not need to be protected. Ma1 and Ma2 represent two first conductive lines formed from the same conductive layer for interconnection, which are connected to the protected node 22a and the node 22b, respectively. Va1 represents a conductive plug. Moreover, Ma3 represents a second conductive line that is electrically connected to the first conductive lines Ma1 and Ma2 through the respective conducting plugs Va1. Accordingly, the protected node 22a is electrically connected to the node 22b.

In FIG. 1B, with conventional routing designs, it is impossible to assure that the length of the conductive lines Ma1, Ma2 or Ma3 is short enough to protect the protected node 22a from the antenna effect. Therefore, when the conductive layers are formed and patterned by means of plasma etch processing, the exposed area may be large enough to induce the antenna current $J_{F-N}$ flowing through the gate oxide and cause damage to the protected node 22a.

Hence, two approaches have been proposed to protect the protected node from antenna damage while conductive layers are patterned by means of plasma etching processes.

One approach adds a P/N junction at the proximal end of the protected node 22a. The P/N junction has a breakdown voltage lower than that of the gate oxide. In other words, the P/N junction enters breakdown before the gate oxide so that it provides a path to discharge the induced antenna current, and therefore acts as a protection circuit for the protected node 22a while plasma etch processing is being applied.

The aforementioned first approach to avoid antenna damage is schematically depicted in FIG. 2. A diode D1 constituted by a P/N junction is arranged on the path of the first conductive line Ma1. The diode D1 has an anode and a cathode connected to ground and the first conductive line Ma1, respectively. The breakdown voltage of the diode D1 is lower than that of the gate oxide. Accordingly, while induced during plasma etch processing, diode breakdown always precedes the gate oxide breakdown. Consequently, the induced antenna current can flow through the diode D1 instead of flowing through the gate oxide and then discharge to ground.

However, as the semiconductor device is scaled down in size, the thickness of the gate oxide decreases and thus the breakdown voltage thereof linearly decreases. When the breakdown voltage for the gate oxide is lower than that of the diode D1, the diode D1 is ineffectual and can not act as the protection circuit for the protected nodes 22a any more. Moreover, the addition of the diode D1 increases layout area and process complexity.

The other approach takes antenna ratio into account so as to constrain the length of each conductive line coupled to the protected node 22a, accordingly, Referring to FIG. 3, the second approach to avoid antenna damage is schematically depicted. First conductive lines M2a and M2ai, formed from the same metal layer, are connected to the node 22b and the protected node 22a, respectively. Second conductive lines M2b and M2bi, formed from the same metal layer, are connected to the first conductive lines M2a and M2ai by conducting plugs V2a and V2ai, respectively. A third conductive line M2c is electrically connected to the second conductive lines M2b and M2bi by conducting plugs V2b. In this approach, the associated length of the underlying conductive lines M2ai and M2bi is strictly limited by the antenna ratio prior to the formation of the top conductive line M2c.

However, the second approach heavily relies on the antenna ratio, and therefore each gate oxide area should be extracted for calculation. For very-large-scale integrated circuit, millions of devices are fabricated on a chip. If each gate oxide area should be extracted for calculation, it is difficult to handle such tremendous data. Currently, few of IC design tools can maturely support the antenna ratio design rules. Furthermore, how to render the allowable antenna ratio precise will spend a lot of time for long-term observation and undue experimentation.

SUMMARY OF THE INVENTION

Therefore, it is an object of the present invention to provide conductive interconnections for an integrated circuit and a method of forming the same, which can protect the gate oxide from antenna damage.

It is another object of the present invention to provide conductive interconnections for an integrated circuit and a method of forming the same in order to improve product yield and reliability.

The present invention achieves the above-indicated objects by providing a method of forming a conductive interconnection between a protected node and a protecting node. According to the present invention, a stacking connector and a routing connector is formed to connect the protected node and the protecting node, respectively. The stacking connector is provided with capability to withstand antenna effect and the routing connector extends toward the stacking connector in charge of routing. Then, a top conductive line is formed to connect the stacking connector and the routing connector Moreover, the present invention achieves the above-indicated objects by providing a conductive interconnection for an integrated circuit between a protected node and a protecting node. The conductive interconnection comprises a stacking connector, a routing connector and a top conductive line. The stacking connector is connected to the protected node, which is constituted by at least one inner conductive line and at least one conductive plug, alternately. The inner conductive line has a length lower than a threshold value constrained by antenna effect. Moreover, the routing connector, extending toward the stacking connector, is connected to the protecting node. Thereafter, the top conductive line is used to connect the stacking connector and the routing connector.

BRIEF DESCRIPTION OF THE DRAWINGS

The following detailed description, given by way of example and not intended to limit the invention solely to the embodiments described herein, will best be understood in conjunction with the accompanying drawings, in which.

DETAILED DESCRIPTION OF THE PREFERRED EMBODIMENTS

Figure 1A:
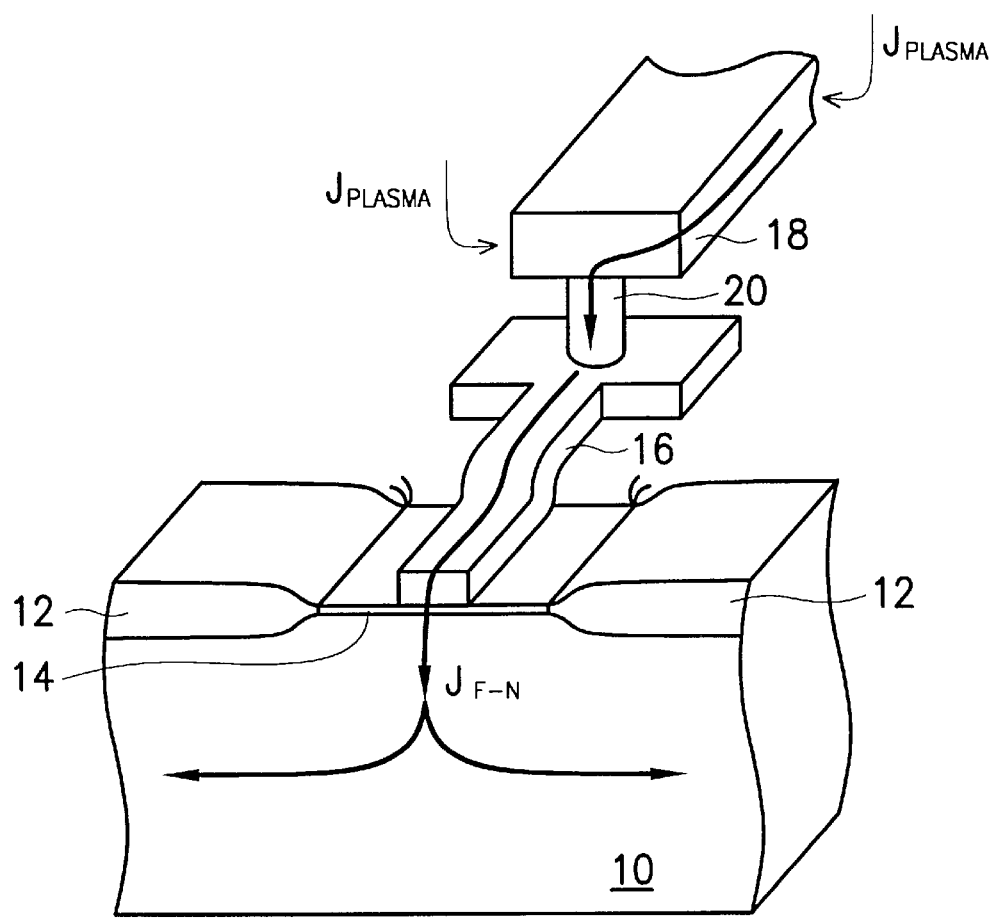
FIG. 1A schematically depicts a perspective view of a conductive interconnection for an integrated circuit to explain antenna effect when a metal layer is patterned by means of plasma etch processing.
Figure 1B:
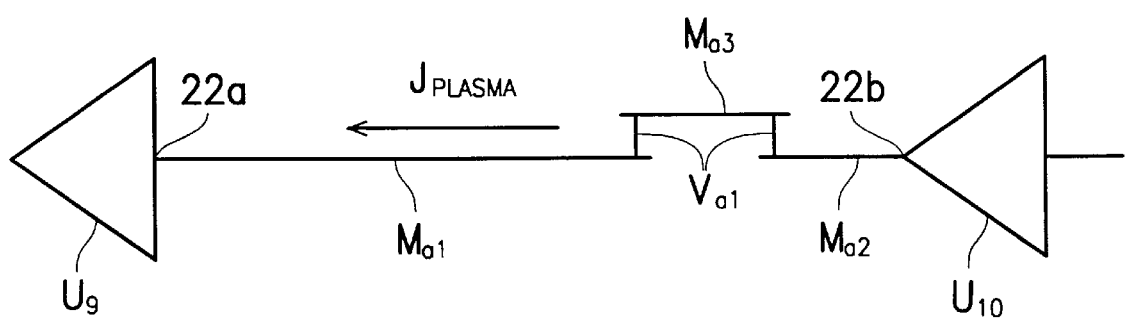
FIG. 1B a schematic diagram to expound antenna effect.
Figure 2:
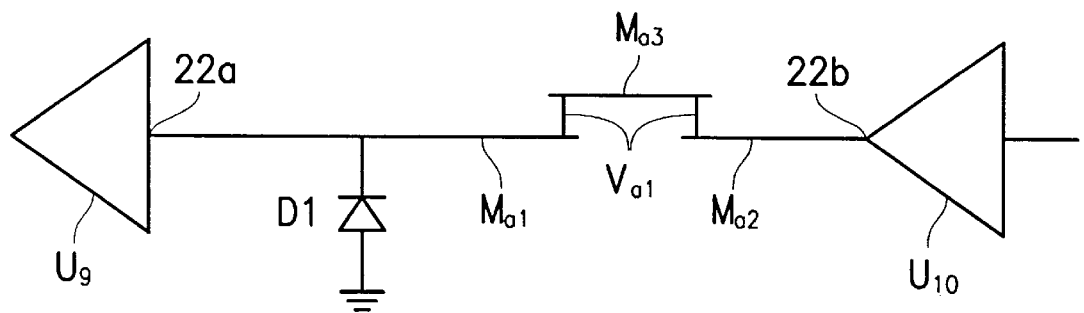
FIG. 2 depicts a schematic diagram of the first conventional approach to solve antenna damage.
Figure 3:
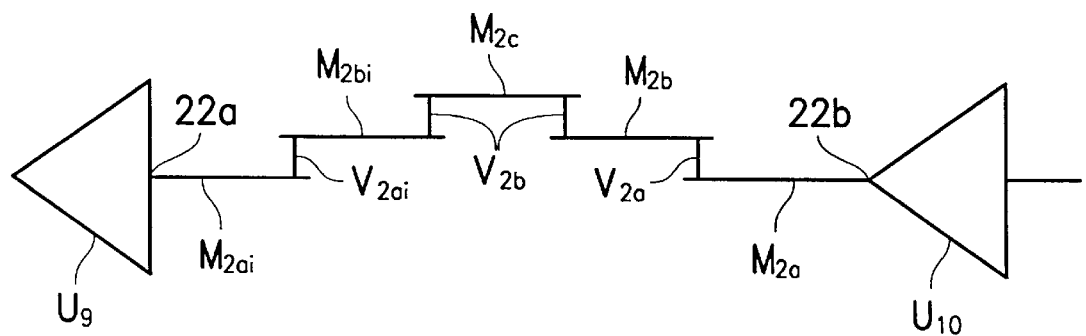
FIG. 3 depicts a schematic diagram of the second conventional approach to solve antenna damage.
Figure 4:
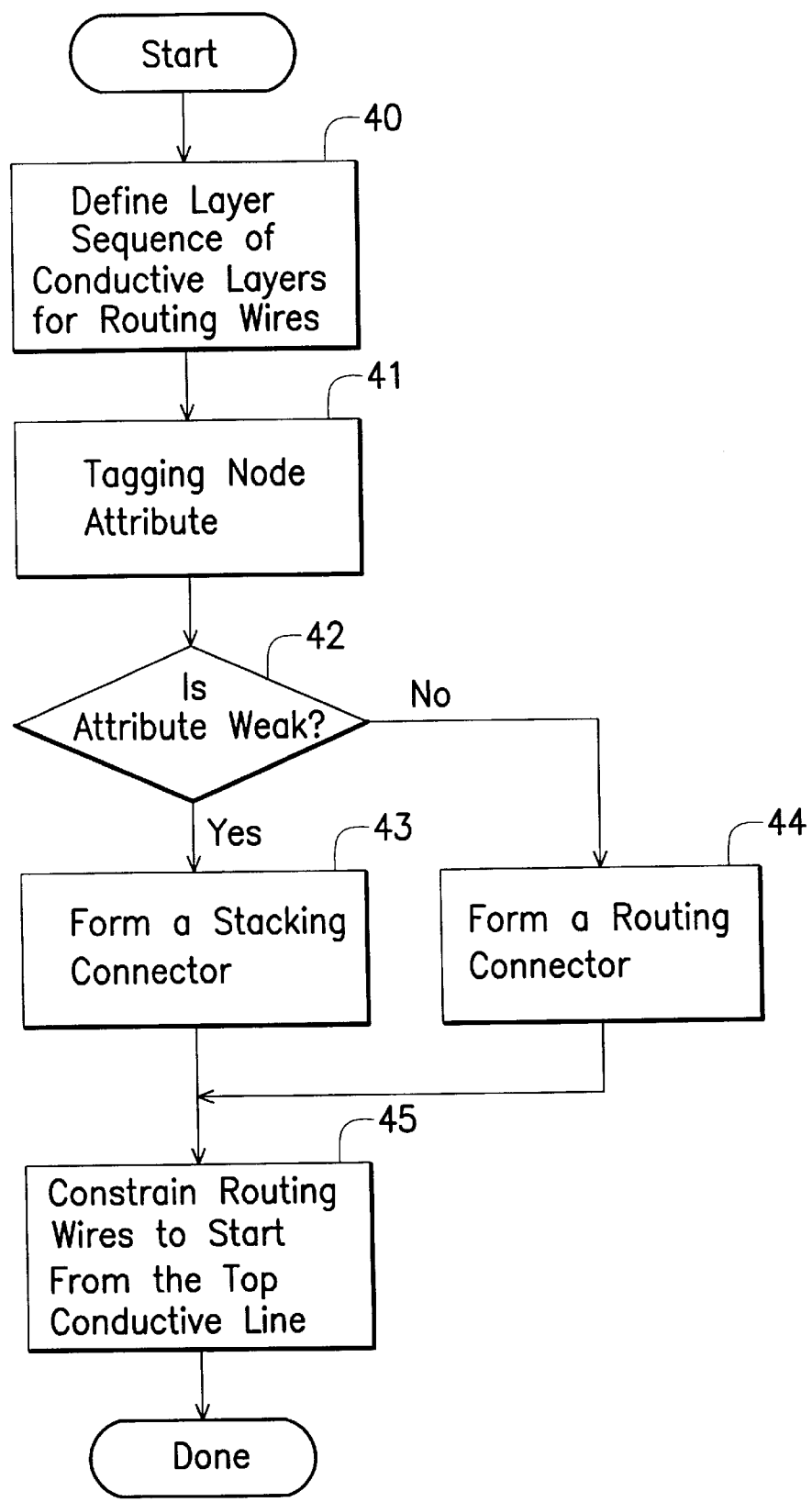
FIG. 4 depicts a flow chart of the method for forming conductive interconnections for an integrated circuit in accordance with the present invention.

Referring to FIG. 4, a flow chart of the method for forming conductive interconnection for an integrated circuit in accordance with the present invention is schematically depicted. The integrated circuit comprises a plurality of devices, for example, transistors, diodes, capacitors, resistors and so on. For very-large-scale integrated circuits, there are over millions of devices fabricated on a single chip. Therefore, the present invention sets forth a method of forming conductive interconnections to protect nodes from antenna damage. However, because gate oxide is more vulnerable to antenna damage, the node to be protected is the gate of a transistor, typically. According to present invention, the steps for implementing the method will be described in detail as follows.

After the devices are fabricated in a semiconductor substrate, routing wires for conductive interconnection among the devices can be determined based upon the required circuit design. Consequently, as shown in FIG. 4, step 40 defines the layer sequence of conductive layers for routing wires. Therefore, the step 40 determines the routing pattern of each conductive layer, including inner metal layers and a top metal layer as well. Then, the step of tagging node attribute follows. In step 41, all circuit nodes (especially, input nodes) should be analyzed and a decision should be made as to which are to be protected. As mentioned above, gates of transistors are vulnerable to antenna damage, and are tagged as "weak" nodes in step 41.

Figure 5:
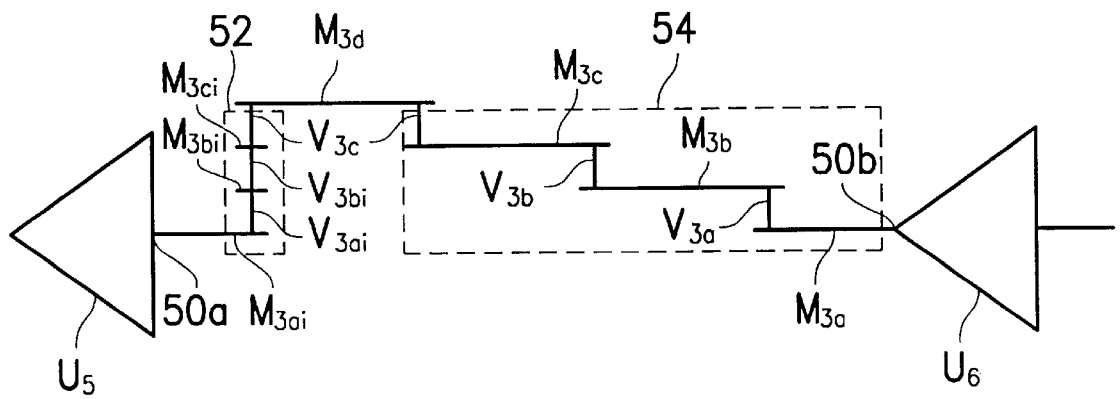
FIG. 5 depicts a schematic diagram of one preferred embodiment formed by means of the method shown in FIG. 4.
Figure 6:
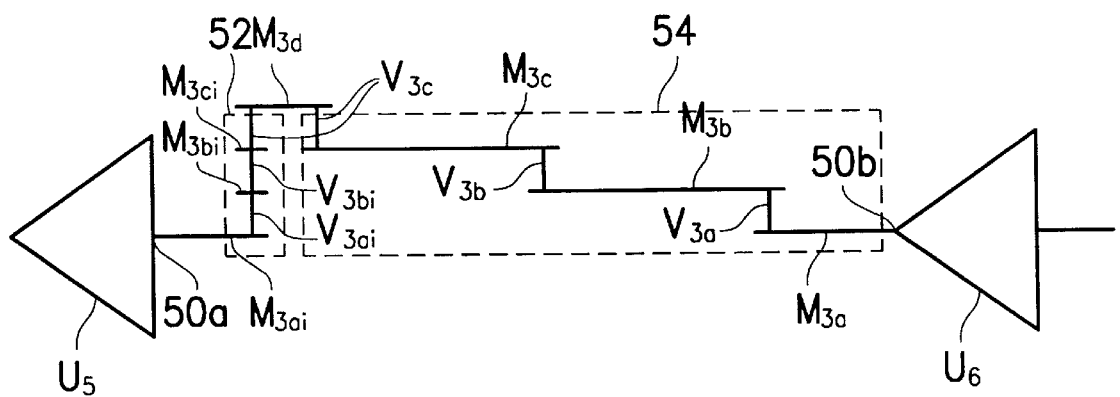
FIG. 6 depicts a schematic diagram of another preferred embodiment formed by means of the method shown in FIG. 4.

Thereafter, step 42 is used to determine whether the attribute of a circuit node is "weak" or not, If yes, a stacking connector 52 (as shown in FIG. 5 or FIG. 6) is formed to electrically connect the "weak" node in step 43; otherwise, a routing connector 54 (as shown in FIG. 5 or FIG. 6) is formed in step 44. From the bottom to the top, the stacking connector 52 comprises at least one inner conductive line and at least one conductive plug, alternately. Correspondingly, the routing connector 54 comprises at least one inner conductive line and at least one conductive plug, alternately. By comparison, the stacking connector 52 is vertically confined within a predetermined range, but the routing connector 54 extends toward the stacking connector 52 in charge of routing.

Finally, in step 45, a top conductive line (M3d in FIGS. 5 and 6) is formed to connect the stacking connector 52 and the routing connector 54. In other words, the stacking connector 52 and the routing connector 54 are disconnected from each other until the top conductive line has been formed.

Referring to FIG. 5, a schematic diagram of one preferred embodiment formed by the method of FIG. 4 is illustrated.

A circuit device U5 has an input terminal 50a denoting a node in the circuit to be protected, hereinafter referred as a protected node. Typically, the terminal 50a is the gate terminal of a MOS transistor. A device U6 represents the circuit unit which does not need to be protected, which might be a diode in the structure of a P/N junction having a breakdown voltage lower than that of the gate oxide. Therefore, the device U6 has an output terminal 50b denoting a node for protection. Normally, if the device U6 has lower breakdown voltage and acts as a protection circuit for the device U5, the antenna current induced during plasma processing can directly discharge through the device U6 instead of flowing through the device U5.

As shown in FIG. 5, a four-level conductive interconnection technology applied to integrated circuit fabrication is exemplified. The protected node 50a will not be connected to the protecting node 50b until a top conductive layer M3d is formed over it. The preceding three conductive layers are respectively cut into several discontinuous pieces. For example, the first conductive layer is divided into first inner conductive lines M3a and M3ai. The second conductive layer is divided into second inner conductive lines M3b and M3bi. The third conductive layer is divided into third inner conductive lines M3c and M3ci. The first conductive lines M3a and M3ai are connected to the second conductive lines M3b and M3bi through conductive plugs V3a and V3ai, respectively. The second inner conductive lines M3b and M3bi are connected to the third inner conductive lines M3c and M3ci through respective conductive plugs V3b and V3bi. The third conductive line M3c and M3ci are both connected to the top conductive layer M3d through conductive plugs V3c.

Note that there are dielectric layers (not shown in the drawing) formed between two adjacent conductive layers for isolation, which are omitted from the drawings for simplification. However, those conductive plugs V3a, V3ai, V3b, V3bi and V3c are formed in the associated dielectric layer.

Accordingly, the stacking connector 52 depicted in FIG. 5 comprises the first inner conductive line M3ai, the conductive plug V3ai, the second inner conductive line M3bi, the conductive plug V3bi, the third inner conductive line M3ci, and the conductive plug V3c. The routing connector 54 comprises the first inner conductive line M3a, the conductive plug V3a, the second inner conductive line M3b, the conductive plug V3b, the third inner conductive line M3c, and the conductive plug V3c. The inner conductive lines M3a, M3b, M3c gradually extend toward the stacking connector 52 for routing, but the conductive lines M3ai, M3bi, M3ci are vertically confined within a predetermined range.

Prior to the formation of the top conductive line M3d, the protected node 50a is merely connected to the inner conductive lines M3ai, M3bi and M3ci while the protecting node 50b is connected to the conductive lines M3a, M3b, and M3c. The associated length of inner conductive lines M3ai, M3bi, and M3ci is short far enough to avoid antenna damage. For example, the line length can be chosen to have a value lower than one-twentieth of a threshold value constrained by antenna effect. Therefore, while forming the inner conductive lines M3ai, M3bi, and M3ci by means of plasma etch processing, the corresponding areas are not sufficient to induce a flow of antenna current through the gate oxide. After the top conductive layer M3d is formed, the protected node 50a can be electrically connected to the protecting node 50b. At this time, even though the top conductive layer M3d is large enough to trigger antenna current during plasma etch processing, the device U6 has lower breakdown voltage and acts as a protection circuit for the device U5. Therefore, the antenna current induced by plasma processing can directly discharge through the device U6 instead of flowing through the device U5.

Preferably, those inner conductive lines M3ai, M3bi, M3ci, M3a, M3b and M3c are composed of polycrystalline silicon, Al, Al/Cu alloy, Al/Si/Cu alloy, Cu, W or silicide. Preferably, the top conductive layer M3d is composed of polycrystalline silicon, Al, Al/Cu alloy, Al/Si/Cu alloy, Cu or W.

As mentioned above, the stacking connector 52 is put on the protected node 50a, comprising the first inner conductive line M3ai, the conductive plug V3ai, the second inner conductive line M3bi, the conductive plug V3bi, the third inner conductive line M3ci, and the conductive plug V3c. Each conductive line M3ai, M3bi, or M3ci formed prior to the formation of the top conductive layer M3d has a length lower than the value constrained by the antenna ratio. For example, the line length can be chosen to have a value lower that one-twentieth of a threshold value constrained by the antenna effect. Therefore, while forming the first, second, and third conductive lines M3ai, M3bi, and M3ci by means of plasma etch processing, the corresponding areas are not sufficient to induce antenna current flow through the gate oxide. After the top conductive layer M3d is formed, the protected node 50a can be electrically connected to the protecting node 50b. At this time, even though the top conductive layer M3d is large enough to trigger antenna current during plasma etch processing, the device U6 has lower breakdown voltage and acts as a protection circuit for the device U5. The antenna current induced by plasma processing can directly discharge through the device U6 instead of flowing through the device U5. Consequently, the protected node 50a will not incur antenna damage.

When the semiconductor device is scaled down in size, the thickness of the gate oxide decreases, and the breakdown voltage thereof decreases. When the breakdown voltage for the gate oxide is lower than that of the device U6, the device U6 is ineffectual and can not act as a protection circuit for the protected node 50a any more. At this time, referring to FIG. 6, a schematic diagram of another preferred embodiment formed by the method of FIG. 4 is illustrated.

If the breakdown voltage of the protecting device U6 higher than that of the gate oxide, the length of the top conductive line M3d will be the concern. While the top conductive line M3d is formed during plasma etch processing, an antenna current will be induced to flow through the gate oxide if its length exceeds a threshold value constrained by the antenna ratio. Consequently, the another preferred embodiment depicted in FIG. 6 decreases the length of the top conductive line M3d to avoid the occurrence of antenna damage during the application of the plasma process. In this embodiment, the length of the top conductive line is lower than the threshold value constrained by the antenna ratio. However, it is quite easy to constrain the length of the top conductive line M3d in accordance with the routing method of the present invention.

In conclusion, the conductive interconnection for an integrate circuit is formed between the protected node and the protecting node. The conductive interconnection comprises the stacking connector, the routing connector and the top conductive line. The stacking connector is formed to connect the protected node, which is constructed by at least one inner conductive line and at least one conductive plug, alternately. The inner conductive line has a length lower than a threshold value constrained by antenna effect. Moreover, the routing connector, extending toward the stacking connector, is formed to connect the protecting node. Moreover, the top conductive line is used to connect the stacking connector and the routing connector. Accordingly, before the top conductive line has been formed only the stacking connector is attached to the protected node thereby protecting it from antenna damage.

The foregoing description of preferred embodiments of the present invention has been provided for the purposes of illustration and description. It is not intended to be exhaustive or to limit the invention to the precise forms disclosed. Many modifications and variations will be apparent to practitioners skilled in the art. The embodiments were chosen and described to best explain the principles of the invention and its practical application, thereby enabling others skilled in the art to understand the invention in order to practice various other embodiments and make various modifications suited to the particular use contemplated. It is intended that the scope of the invention be defined by the following claims and their equivalents.

What is claimed is:

1. A method of forming a conductive interconnection between a protected node and a second node, comprising:

defining a stacking connector connected to the protected node, wherein the stacking connector is constructed and arranged so as to withstand an antenna effect and connects the protected node to a top layer among a plurality of conductive layers; and defining a pattern of the conductive layers to define a routing connector for connecting the protected node to the second node;

wherein the routing connector and the stacking connector are disconnected from each other until forming a top conductive line by patterning the top layer.

2. The method as claimed in claim 1, wherein said top conductive line is connected to said stacking connector and said routing connector via respective conductive plugs.

3. The method as claimed in claim 1, wherein said stacking connector alternately comprises at least one inner conductive line and at least one conductive plug, said inner conductive line having a length less than a threshold value constrained by said antenna effect.

4. The method as claimed in claim 3, wherein said inner conductive layer is made of conductive material selected from the group consisting of polycrystalline silicon, Al, Al/Cu, Al/Si/Cu, Cu, W and silicide.

5. The method as claimed in claim 1, wherein said top conductive line has a length less than a threshold value constrained by said antenna effect.

6. The method as claimed in claim 5, wherein said top conductive layer is made of conductive material selected from the group consisting of polycrystalline silicon, Al, Al/Cu, Al/Si/Cu, Cu and W.

7. The method as claimed in claim 1, wherein the protected node is a gate of a metal-oxide-semiconductor transistor.

8. The method as claimed in claim 1, wherein the second node is a protecting node for protecting the protected node.

9. The method as claimed in claim 8, wherein the protecting node is an output terminal of a device.

10. A method for forming a conductive interconnection between a first circuit node and a second circuit node, comprising:

defining a layer sequence of conductive layers for routing wires, wherein the conductive layers include a top layer;

analyzing the circuit nodes to determine which node needs to be protected from antenna damage, and defining that node as a protected node;

connecting a stacking connector to the protected node, wherein the stacking connector is constructed and arranged so as to withstand an antenna effect and connects the protected node to the top layer; and defining a routing connector for connecting the protected node to the other node, via the top layer, wherein the routing connector and the stacking connector are disconnected from each other until forming a top conductive line by patterning the top layer.

11. The method as claimed in claim 10, wherein the top conductive line is connected to the stacking connector via conductive plugs.

12. The method as claimed in claim 10, wherein the stacking connector alternately comprises at least one inner conductive line and at least one conductive plug, the inner conductive line having a length less than a threshold value constrained by the antenna effect.

13. The method as claimed in claim 12, wherein the inner conductive layer is made of conductive material selected from the group consisting of polycrystalline silicon, Al, Al/Cu, Al/Si/Cu, Cu, W, and silicide.

14. The method as in claim 10, wherein the top conductive layer is made of conductive material selected from the group consisting of polycrystalline silicon, Al, Al/Cu, Al/Si/Cu, Cu, and W.

15. The method as claimed in claim 10, wherein the protected node is a gate of a metal-oxide-semiconductor transistor.

* * * * *